United States Patent
Kawasaki

(10) Patent No.: US 9,754,767 B2
(45) Date of Patent: Sep. 5, 2017

(54) RF PULSE REFLECTION REDUCTION FOR PROCESSING SUBSTRATES

(71) Applicant: APPLIED MATERIALS, INC., Santa Clara, CA (US)

(72) Inventor: Katsumasa Kawasaki, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/212,879

(22) Filed: Jul. 18, 2016

(65) Prior Publication Data

US 2017/0103873 A1    Apr. 13, 2017

Related U.S. Application Data

(60) Provisional application No. 62/241,008, filed on Oct. 13, 2015.

(51) Int. Cl.
  *H01J 7/24*  (2006.01)
  *H01J 37/32*  (2006.01)

(52) U.S. Cl.
  CPC .. *H01J 37/32183* (2013.01); *H01J 37/32155* (2013.01)

(58) Field of Classification Search
  CPC ........... H01J 37/32082; H01J 37/32091; H01J 37/32155; H01J 37/32183; H01J 37/32146; H01J 37/32165; H01J 37/3244
  USPC .................................. 315/111.21; 156/345.28
  See application file for complete search history.

(56) References Cited

U.S. PATENT DOCUMENTS

| | | | |
|---|---|---|---|
| 6,472,822 B1 | 10/2002 | Chen et al. | |
| 6,566,272 B2 | 5/2003 | Paterson et al. | |
| 6,777,037 B2 * | 8/2004 | Sumiya | H01J 37/32192 216/67 |
| 6,818,562 B2 | 11/2004 | Todorow et al. | |
| 6,885,153 B2 * | 4/2005 | Quon | H01J 37/32935 |
| 6,942,813 B2 | 9/2005 | Ying et al. | |
| 7,141,514 B2 | 11/2006 | Chua | |
| 7,214,628 B2 | 5/2007 | Chua | |

(Continued)

OTHER PUBLICATIONS

International Search Report and Written Opinion dated Oct. 24, 2016 for PCT Application No. PCT/US2016/042952.

(Continued)

*Primary Examiner* — Tung X Le
(74) *Attorney, Agent, or Firm* — Moser Taboada; Alan Taboada

(57) ABSTRACT

Methods and systems for RF pulse reflection reduction in process chambers are provided herein. In some embodiments, a method includes (a) providing a plurality of pulsed RF power waveforms from a plurality of RF generators during a first time period, (b) determining an initial reflected power profile for each of the plurality of pulsed RF power waveforms, (c) for each of the plurality of pulsed RF power waveforms, determining a highest level of reflected power, and controlling at least one of a match network or the RF generator to reduce the highest level of reflected power, (d) determining an adjusted reflected power profile for each of the plurality of pulsed RF power waveforms and (e) repeating (c) and (d) until the adjusted reflected power profile for each of the plurality of pulsed RF power waveforms is within a threshold tuning range.

20 Claims, 9 Drawing Sheets

(56) References Cited

U.S. PATENT DOCUMENTS

| | | |
|---|---|---|
| 7,718,538 B2 | 5/2010 | Kim et al. |
| 7,737,042 B2 | 6/2010 | Kim et al. |
| 7,771,606 B2 | 8/2010 | Kim et al. |
| 7,967,944 B2 | 6/2011 | Shannon et al. |
| 8,002,945 B2 * | 8/2011 | Shannon ........... H01J 37/32091 156/345.2 |
| 8,018,164 B2 | 9/2011 | Shannon et al. |
| 8,264,154 B2 | 9/2012 | Banner et al. |
| 8,324,525 B2 | 12/2012 | Shannon et al. |
| 8,337,661 B2 | 12/2012 | Shannon et al. |
| 8,357,264 B2 | 1/2013 | Shannon et al. |
| 8,404,598 B2 | 3/2013 | Liao et al. |
| 8,658,541 B2 | 2/2014 | Lee et al. |
| 8,808,561 B2 | 8/2014 | Kanarik et al. |
| 8,883,028 B2 | 11/2014 | Kanarik |
| 8,962,488 B2 | 2/2015 | Liao et al. |
| 8,974,684 B2 | 3/2015 | Banna et al. |
| 9,053,908 B2 | 6/2015 | Sriraman et al. |
| 9,171,699 B2 | 10/2015 | Valcore, Jr. et al. |
| 9,197,196 B2 | 11/2015 | Valcore, Jr. et al. |
| 9,243,320 B2 | 1/2016 | Nashiki et al. |
| 9,318,304 B2 | 4/2016 | Leray et al. |
| 9,536,749 B2 | 1/2017 | Marakhtanov et al. |
| 2003/0052085 A1 | 3/2003 | Parsons |
| 2011/0009999 A1 | 1/2011 | Zhang et al. |
| 2011/0031216 A1 | 2/2011 | Liao |
| 2012/0262064 A1 * | 10/2012 | Nagarkatti ........ H01J 37/32082 315/111.21 |
| 2014/0009073 A1 | 1/2014 | Valcore, Jr. et al. |
| 2014/0265852 A1 | 9/2014 | Valcore, Jr. |
| 2014/0305589 A1 | 10/2014 | Valcore, Jr. |
| 2014/0367043 A1 | 12/2014 | Bishara et al. |
| 2015/0002018 A1 | 1/2015 | Lill et al. |
| 2015/0020971 A1 | 1/2015 | Kanarik |
| 2015/0047840 A1 | 2/2015 | Hurtado |
| 2015/0072530 A1 | 3/2015 | Kim et al. |
| 2015/0130354 A1 | 5/2015 | Leray et al. |
| 2015/0206716 A1 | 7/2015 | Kim |

OTHER PUBLICATIONS

U.S. Appl. No. 14/882,878, filed Oct. 14, 2015, Kawaksaki et al.
U.S. Appl. No. 14/886,891, filed Oct. 19, 2015, Kawaksaki et al.
U.S. Appl. No. 15/007,818, filed Jan. 27, 2016, Kawzaksaki.
U.S. Appl. No. 15/068,999, filed Mar. 14, 2016, Leray et al.
U.S. Appl. No. 15/212,485, filed Jul. 18, 2016, Leray.

* cited by examiner

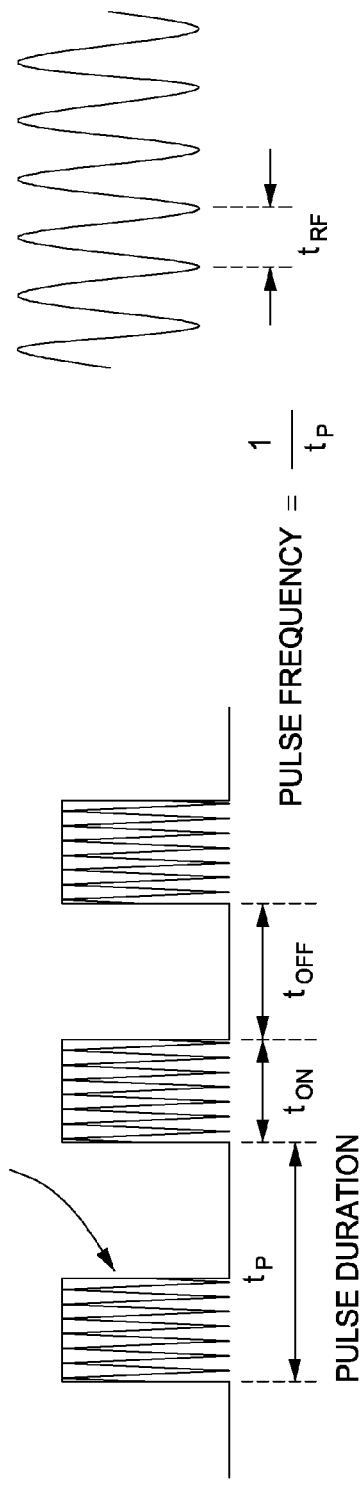
FIG. 2A
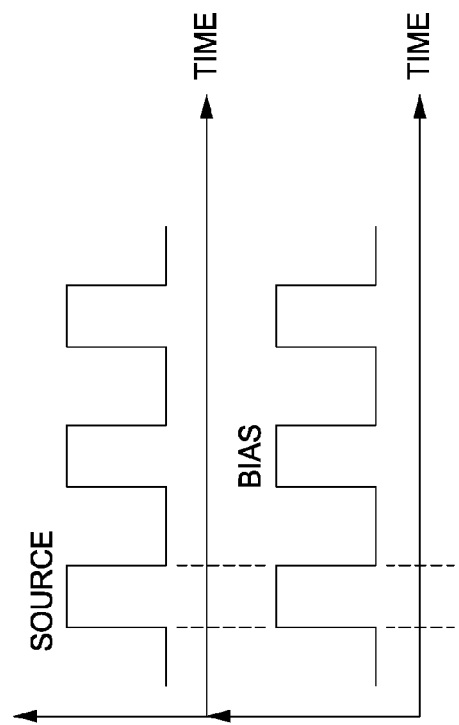
FIG. 2B
FIG. 2C

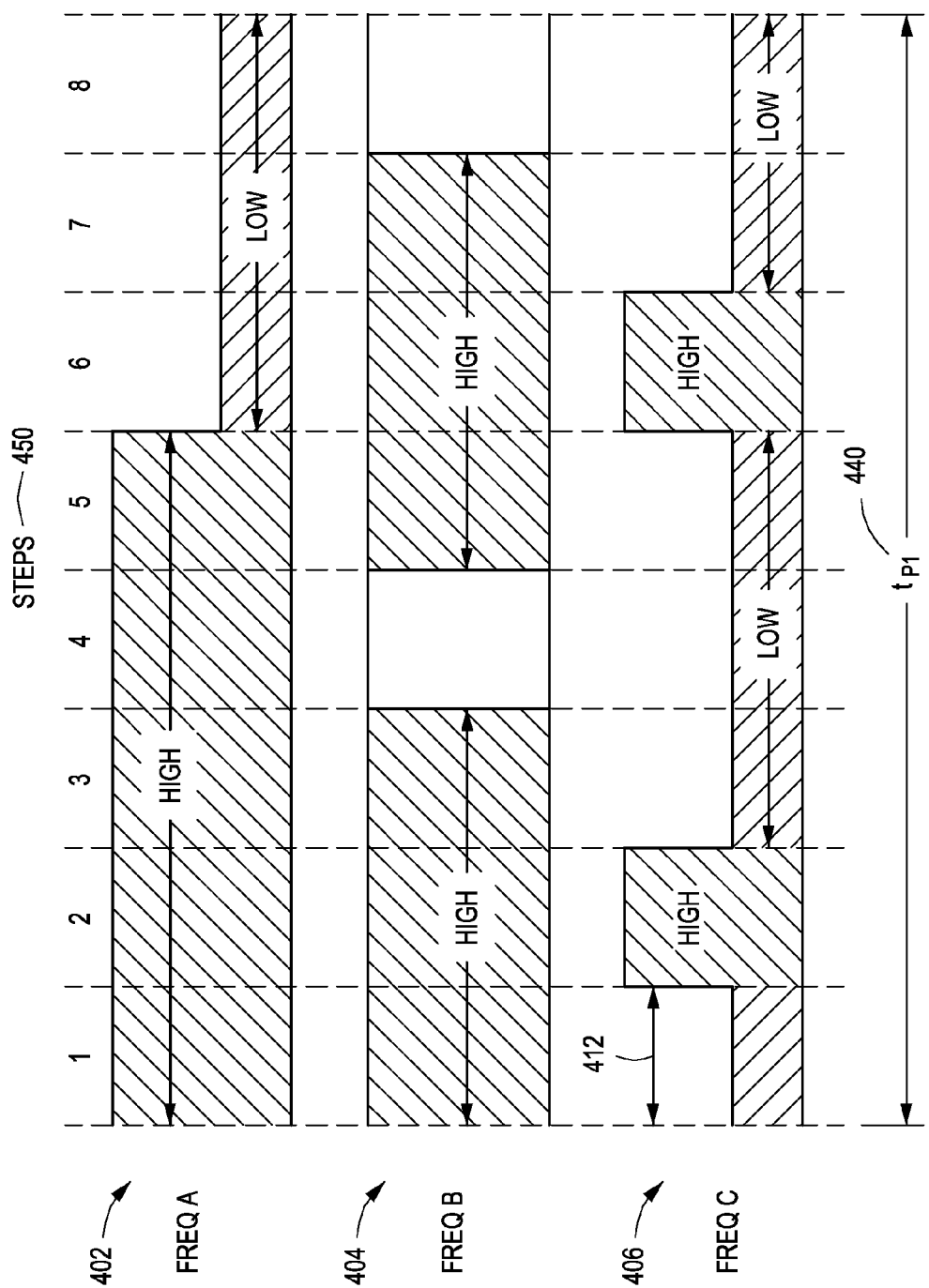

RF PULSE REFLECTION REDUCTION FOR PROCESSING SUBSTRATES

CROSS-REFERENCE TO RELATED APPLICATIONS

This application claims benefit of U.S. provisional patent application Ser. No. 62/241,008, filed Oct. 13, 2015, which is herein incorporated by reference.

FIELD

Embodiments of the present disclosure generally relate to RF power delivery methods used for processing a substrate.

BACKGROUND

In conventional radio frequency (RF) plasma processing, such as that used during stages of fabrication of many semiconductor devices; RF energy, which may be generated in continuous or pulsed wave modes, may be provided to a substrate process chamber via an RF energy source. Due to mismatches between the impedance of the RF energy source and the plasma formed in the process chamber, RF energy is reflected back to the RF energy source, resulting in inefficient use of the RF energy and wasting energy, potential damage to the process chamber or RF energy source, and potential inconsistency/non-repeatability issues with respect to substrate processing. As such, the RF energy is often coupled to the plasma in the process chamber through a fixed or tunable matching network that operates to minimize the reflected RF energy by more closely matching the impedance of the plasma to the impedance of the RF energy source. The matching network ensures that the output of the RF source is efficiently coupled to the plasma to maximize the amount of energy coupled to the plasma (e.g., referred to as tuning the RF power delivery). Thus, the matching network ensures that the total impedance (i.e., plasma impedance+chamber impedance+matching network impedance) is the same as the output impedance of the RF power delivery. In some embodiments, the RF energy source may also be capable of frequency tuning, or adjusting the frequency of the RF energy provided by the RF energy source, in order to assist in impedance matching.

In process chambers that use multiple separate RF power signals pulsed at multiple power levels, synchronized RF pulsing is typically used. The multiple separate RF power signals may be pulsed independently out-of-phase with each other, or with varying duty cycle. Synchronization may be accomplished through the use of transistor-transistor logic (TTL) signals. One master generator creates the TTL signal to the other slave generators for synchronization. Each RF generator (masters and slaves) can provide pulsed RF power at independent duty cycles and/or pulse delays.

However, in dual level pulsing using multiple separate RF power signals pulsed at multiple power levels (e.g., each with high/low power settings), the impedance change in one pulse duty cycle makes impedance tuning difficult. That is, the match network and/or RF generators cannot adequately tune for the reflected power as the reflected power changes multiple times within each duty cycle.

Accordingly, the inventors have provided improved methods and apparatus for RF pulse reflection reduction in process chambers that use multiple separate RF power signals, pulsed at multiple power levels.

SUMMARY

Methods of operating a plasma enhanced substrate processing system for RF pulse reflection reduction in process chambers are provided herein. In some embodiments, a method of operating a plasma enhanced substrate processing system for RF pulse reflection reduction in process chambers includes (a) providing a plurality of pulsed RF power waveforms from a plurality of RF generators to a process chamber during a first time period, (b) determining an initial reflected power profile for each of the plurality of pulsed RF power waveforms, (c) for each of the plurality of pulsed RF power waveforms, determining a highest level of reflected power during the first time period, and controlling at least one of a match network coupled to an RF generator that produced the pulsed RF power waveform, or the RF generator that produced the pulsed RF power waveform, to reduce the highest level of reflected power, (d) determining an adjusted reflected power profile for each of the plurality of pulsed RF power waveforms and (e) repeating (c) and (d) until the adjusted reflected power profile for each of the plurality of pulsed RF power waveforms is within a threshold tuning range.

In some embodiments, a non-transitory computer readable medium having instructions stored thereon that, when executed, cause a method of RF pulse reflection reduction in process chambers to be performed. The method performed may include (a) providing a plurality of pulsed RF power waveforms from a plurality of RF generators to a process chamber during a first time period, (b) determining an initial reflected power profile for each of the plurality of pulsed RF power waveforms, (c) for each of the plurality of pulsed RF power waveforms, determining a highest level of reflected power during the first time period, and controlling at least one of a match network coupled to an RF generator that produced the pulsed RF power waveform, or the RF generator that produced the pulsed RF power waveform, to reduce the highest level of reflected power, (d) determining an adjusted reflected power profile for each of the plurality of pulsed RF power waveforms and (e) repeating (c) and (d) until the adjusted reflected power profile for each of the plurality of pulsed RF power waveforms is within a threshold tuning range.

In some embodiments, substrate processing system may include a plurality of RF generators configured to provide a plurality of pulsed RF power waveforms to a process chamber during a first time period, a plurality of sensors configured to measure reflected power for the plurality of pulsed RF power waveforms, and a plurality of match networks each coupled to one of the plurality of RF generators, wherein each of the plurality of match networks is configured to: (a) determine a reflected power profile for one of the plurality of pulsed RF power waveforms based on measurements from one of the plurality of sensors; (b) determine a highest level of reflected power of the reflected power profile during the first time period; (c) reduce the highest level of reflected power; (d) determine an adjusted reflected power profile for each of the plurality of pulsed RF power waveforms based on a second set of measurements from one of the plurality of sensors; and (e) repeating (b) and (d) until the adjusted reflected power profile for each of the plurality of pulsed RF power waveforms is within a threshold tuning range.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 2A-C depicts pulsed waveforms of radio frequency signals in accordance with some embodiments of the present disclosure.

FIG. 4A-B depicts multiple separate RF power signals pulsed at multiple power levels in accordance with some embodiments of the present disclosure.

Figure 1:
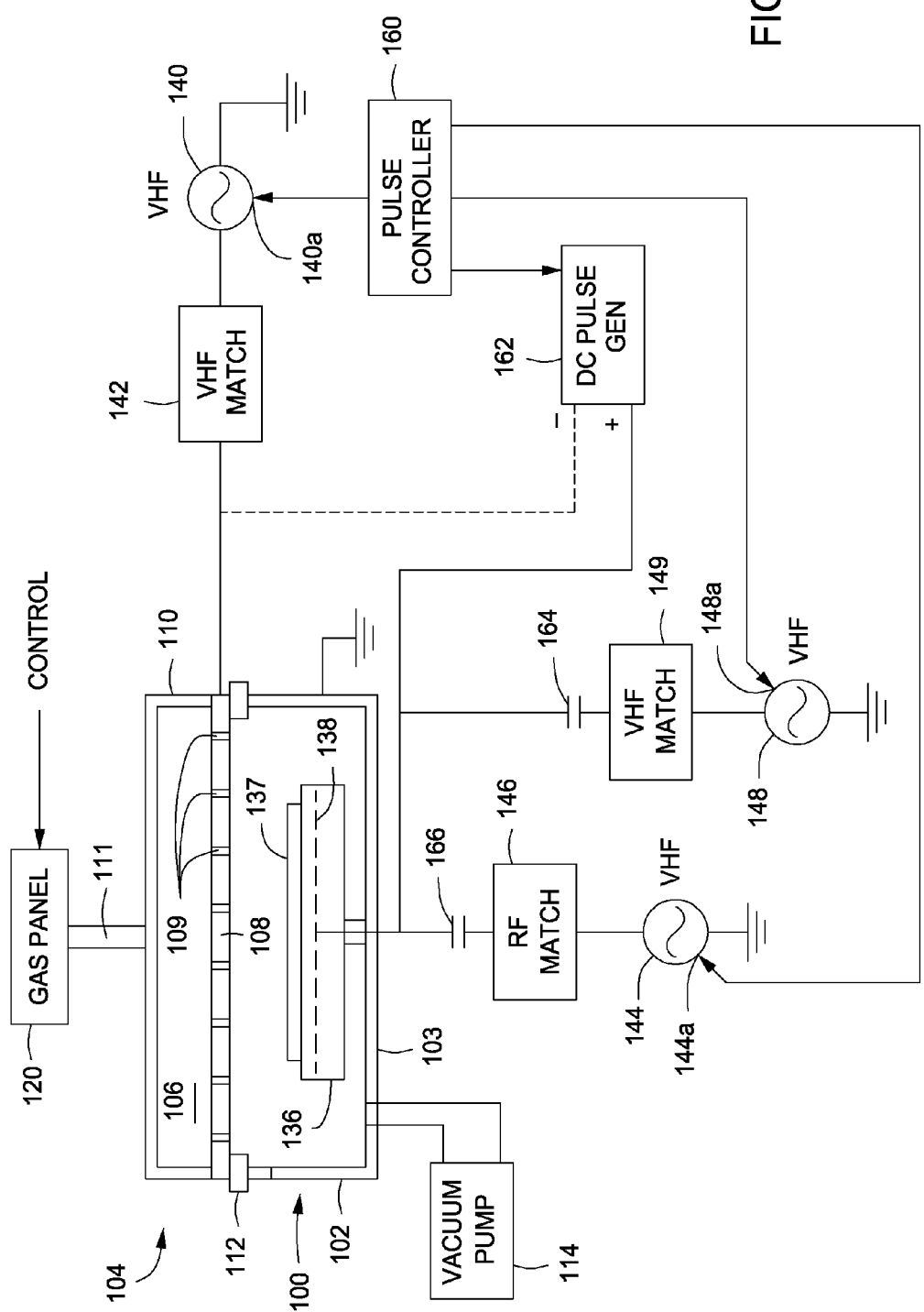
FIG. 1 depicts a plasma reactor in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide improved methods and apparatus for RF pulse reflection reduction in process chambers that use multiple separate RF power signals pulsed at multiple power levels. Specifically, a tuning threshold range is determined which defines an acceptable/desired range between the highest and lowest reflected power readings. Embodiments of the present disclosure focus on the highest reflected power point in one duty cycle, and tune this highest reflected power point. The highest reflected power point is tuned using matching network and/or RF generators. The highest reflected power is updated and the total reflected power is then checked against the tuning threshold range determined. If all of reflected powers are with the threshold range, tuning will be stopped. If not, the tuning process will be repeated until the difference between highest reflected power point and lowest reflected power point reaches certain threshold level (i.e., within the a tuning threshold range). Embodiments of the present disclosure advantageously provide consistent power regulation and improved productivity, and better chamber to chamber matching.

FIG. 1 depicts a plasma reactor which may be utilized to perform the inventive methods disclosed herein. The inventive methods may be performed in a capacitively coupled plasma reactor (e.g., as illustrated in FIG. 1) or any other suitable plasma reactor, such as an inductive coupled plasma reactor. However, the inventors have observed that the inventive methods can be particularly beneficial in capacitively coupled plasma reactors, such as where high bias power (e.g., about 2000 W or more) and low source power (e.g., about 500 W or less) is used, as undesired charging effects can be much more severe than, for example, in inductively coupled plasma processing chambers. In some embodiments, the inventors have discovered that the present inventive methods provide particular benefit in configurations where at least one of a DC bias ($V_{DC}$), a $V_{RF}$, or a plasma sheath voltage are at or above about 1000V.

The reactor of FIG. 1 includes a reactor chamber 100 enclosed by a cylindrical side wall 102, a floor 103 and a ceiling 104. The ceiling 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., ceiling 104) is electrically insulated from the cylindrical side wall 102 by an insulating ring 112. A vacuum pump 114, such a turbomolecular pump, evacuates the chamber 100. A gas panel 120 controls the individual flow rates of different process gases to the gas supply inlet 111. A workpiece support pedestal 136 supported through the floor 103 of the chamber may have an insulating top surface and an internal electrode (wafer support electrode 138). The internal electrode may, for example, be used for chucking a substrate 137 on the top surface of the support pedestal 136. Plasma source power is applied to the ceiling 104 (also referred to herein as a gas distribution showerhead) from a generator 140 through an impedance matching network 142. The ceiling or gas distribution showerhead is formed of a conductive material, such as aluminum for example, and therefore serves as a ceiling electrode. The generator 140 may generate VHF power in the high portion of the VHF spectrum, such as in a range of 100 to 200 MHz. The generator 140 has the capability of pulsing the VHF power generated at a desired pulse rate and duty cycle. For this purpose, the VHF source generator 140 has a pulse control input 140a for receiving a control signal or signals defining the pulse rate and/or duty cycle as well as the phase of each pulse produced by the RF generator 140.

Plasma bias power is applied to the wafer support electrode 138 from an RF bias generator 144 through an RF impedance matching network 146, and RF bias generator 148 through an RF impedance matching network 149. The RF bias generators 144, 148 may generate HF or LF power in the low portion of the HF spectrum or in the MF or LF spectrum, such as in a range of 13.56 MHz or a on the order of 1-2 MHz. The RF bias generators 144, 148 have the capability of pulsing the RF bias power generated at a desired pulse rate and duty cycle. For this purpose, the RF bias generators 144, 148 have pulse control inputs 144a, 148a for receiving a control signal or signals defining the pulse rate and/or duty cycle as well as the phase of each pulse produced by the RF generators 144,148. The RF bias generators 144, 148 may be independently pulsed, phased, and/or duty cycle controlled. Further, the RF bias generators 144, 148 may be pulsed synchronously or asynchronously.

Optionally, plasma source power may be applied to the wafer support electrode 138 from a second VHF generator through a VHF impedance match (not shown). The second VHF generator may generate VHF power in the low portion of the VHF spectrum, such as in a range of 50 to 100 MHz. The second VHF generator has the capability of pulsing the VHF power generated at a desired pulse rate and duty cycle. For this purpose, the second VHF generator has a pulse control input for receiving a control signal or signals defining the pulse rate and/or duty cycle as well as the phase of each pulse produced by the second VHF generator. For example, in some embodiments, one of the RF bias generators 144, 148 and its components (e.g., match, pulse control inputs, etc.) can be replaced with the second VHF generator and its components. Alternatively, the second VHF generator and its components may be included in addition to the first RF generator 140, and the bias generators 144, 148 and their respective components.

In some embodiments, the matching networks 142, 146, and 149 may be formed by one or more capacitors and/or an inductor. The values of capacitor may be electronically or mechanically tuned to adjust the matching of each of the matching networks 142, 146, and 149. In lower power systems, the one or more capacitors may be electronically tuned rather than mechanically tuned. In some embodiments, the matching networks 142, 146, and 149 may have a tunable inductor. In some embodiments, one or more of the capacitors used in the matching networks 142, 146, and 149 may be one or more fixed capacitors or series capacitors. In other embodiments, one or more of the capacitors used in the matching networks 142, 146, and 149 may be a variable capacitor, which may be electronically or mechanically tuned to adjust the matching of the matching networks 142, 146, and 149. In some embodiments, one or more of the matching networks 142, 146, and 149 may have a capacitive shunt to ground. The above described matching networks are illustrative only and other various configurations of matching networks having one or more adjustable elements for tuning the matching network may be utilized and tuned in accordance with the teachings provided herein.

A pulse controller 160 is programmable to apply pulse control signals to each of the pulse control inputs 140a, 144a, 148a of the generators 140, 144, 148, to produce the desired phase lead or lag relationship and/or duty cycle relationship among the pulses of the generator 140 (e.g., VHF source power generator) and the RF bias power generators 144, 148. Although shown as a separate component in FIG. 1, in some embodiments, the pulse controller 160 can be disposed internally inside of each RF generator. Synchronization signals would be generated at a master generator (e.g., generator 140), and sent to other slave generators (e.g., generators 144 and/or 148).

In some embodiments, the RF generators 140, 144 and 148, the match networks 142, 146, and 149, and/or the pulse controller 160 comprise a central processing unit (CPU), a plurality of support circuits, and a memory. While the present exemplary embodiments of the RF generators 140, 144 and 148, the match networks 142, 146, and 149 and pulse controller 160 are discussed with respect to a computer having a CPU, support circuits, and a memory, one of ordinary skill in the art would recognize that RF generators 140, 144 and 148, the match networks 142, 146, and 149, and pulse controller 160 could be implemented in a variety of ways, including as an application specific interface circuit (ASIC), a field-programmable gate array (FPGA), a system-on-a-chip (SOC), and the like. Various embodiments of the pulse controller 160 may also be integrated within other process tool controllers, with corresponding input/output interfaces as known in the art.

The support circuits may include a display device as well as other circuits to support the functionality of the CPU. Such circuits may include clock circuits, cache, power supplies, network cards, video circuits and the like The memory may comprise read only memory, random access memory, removable memory, disk drives, optical drives and/or other forms of digital storage. The memory is configured to store an operating system, and a sub-fab control module. The operating system executes to control the general operation of the RF generators 140, 144 and 148, the match networks 142, 146, and 149, and pulse controller 160, including facilitating the execution of various processes, applications, and modules to control the one or more generators 140, 144 and 148 or the match networks 142, 146, and 149 in order to perform the methods discussed here (e.g., method 600 discussed below).

Further, a DC generator 162 may be coupled to either (or both) the wafer support electrode 138 and the ceiling 104. In some embodiments, DC generator 162 may supply continuous and/or variable DC. In some embodiments, DC generator 162 may provide pulsed DC power. The pulse repetition rate, phase and duty cycle of the DC generator are controlled by the pulsed controller 160. A DC isolation capacitor 164, 166 may be provided to isolate each RF generator from the DC generator 162. A DC signal generated by the DC generator may be synchronized with the RF signals generated by the generators 140, 144, and 148 to provide benefits such as reduced charge-up on a substrate 137 or improved etch rate control of the substrate using a plasma formed in the plasma reactor.

FIG. 2A depicts a time domain waveform diagram that may reflect the pulsed RF output of each of the generators 140, 144, 148, showing the pulse envelope of the pulsed RF output, characterized by the following parameters controlled by the pulse controller 160 individually for each generator 140, 144, 148: a pulse duration $t_P$, a pulse "on" time $t_{ON}$, a pulse "off" time $t_{OFF}$, a pulse frequency $1/t_P$, and a pulse duty cycle $(t_{ON}/t_P) \cdot 100$ percent. The pulse duration $t_P$ is the sum of $t_{ON}$ and $t_{OFF}$.

FIGS. 2B and 2C depict contemporaneous time domain waveforms of two RF pulsed signals synchronized together in such a manner that they have identical phase and duty cycle and therefore a phase difference of zero between them. The exemplary embodiment depicted in FIGS. 2B and 2C is one exemplary form of synchronization between a first pulsed RF signal (e.g., a pulsed source signal) and a second pulsed RF signal (e.g., a pulsed bias signal). In this exemplary embodiment, both the phase and duty cycle of each pulsed signal is the same.

Figure 3B:
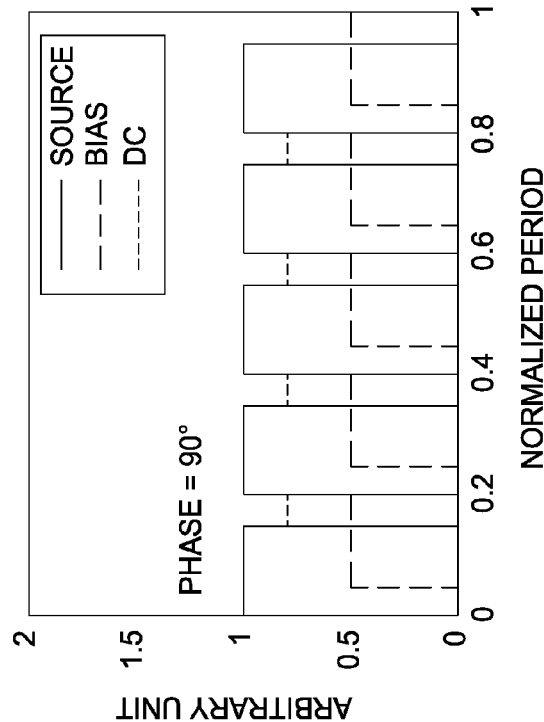
FIG. 3A-D depicts phase variance between pulsed waveforms in accordance with some embodiments of the present disclosure.
Figure 3A:
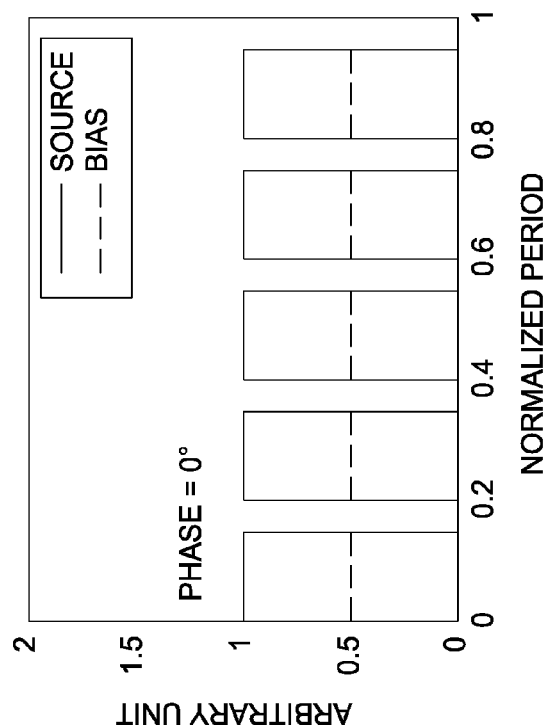
Figure 3C:
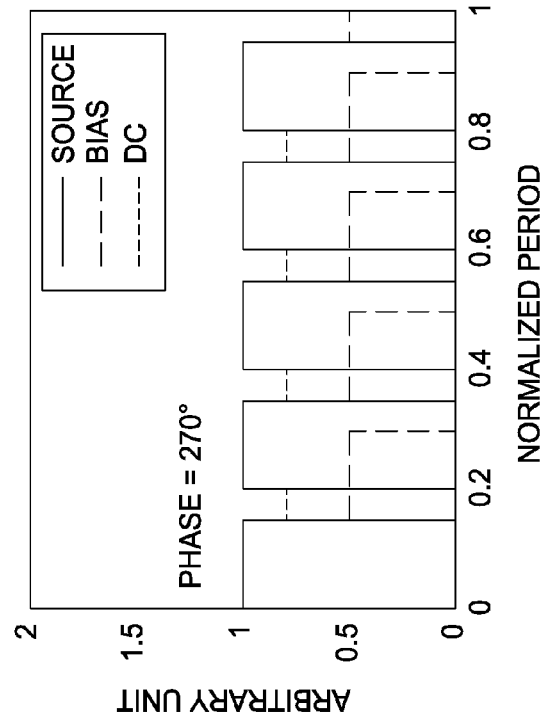
Figure 3D:
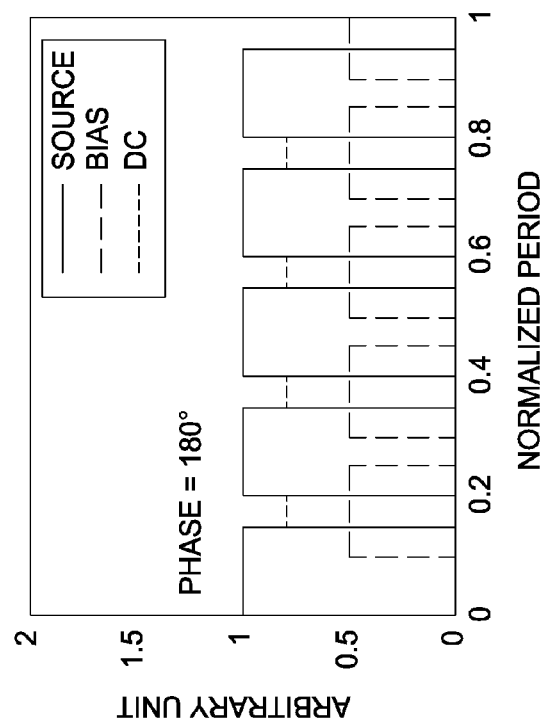

In some embodiments of the present disclosure, the pulsed signals provided by the generators 140, 144, and 148 are varied in phase. FIGS. 3A through 3D illustrate how the phase difference may be varied by the pulse controller 160, and depict the superposition of the source and bias power waveforms at phase differences of 0°, 90°, 180° and 270°, respectively, where the phase difference is defined by how much the second pulse output lags the first pulse output. FIG. 3A corresponds to the example of zero phase difference of FIG. 2B. FIG. 3B depicts a case in which the bias power pulse output lags the source power pulse output by 90°. FIG. 3C depicts a case in which the bias power pulse output lags the source power pulse output by 180 degrees. FIG. 3D depicts a case in which the bias power pulse output lags the source power pulse output by 270°. Although FIGS. 3A-3B only depict two pulsed RF signals with varying phase, in embodiments consistent with the present disclosure can also include three or more pulsed RF signals with varying phases.

In some embodiments, etching rates may be enhanced while pulsing the plasma by controlling the phase lead or lag of the RF envelopes. When the source and bias are pulsed independently out-of-phase, or with varying duty cycle, the different plasma dynamics of the very high frequency (VHF) and low frequency (LF) allow for better plasma fill over the entire pulse. In some embodiments, a combination of VHF of about 162 MHz source frequency is used in conjunction with a bias frequency of about 13.56 MHz and another bias frequency of about 2 MHz. In some embodiments, a combination of VHF of about 162 MHz source frequency is used in conjunction with a bias frequency of about 60 MHz and another bias frequency of about 2 MHz. In some embodiments, a source frequency of about 60 MHz is used in combination with bias frequencies of about 2 MHz and/or about 13.56 MHz.

Figure 4A:
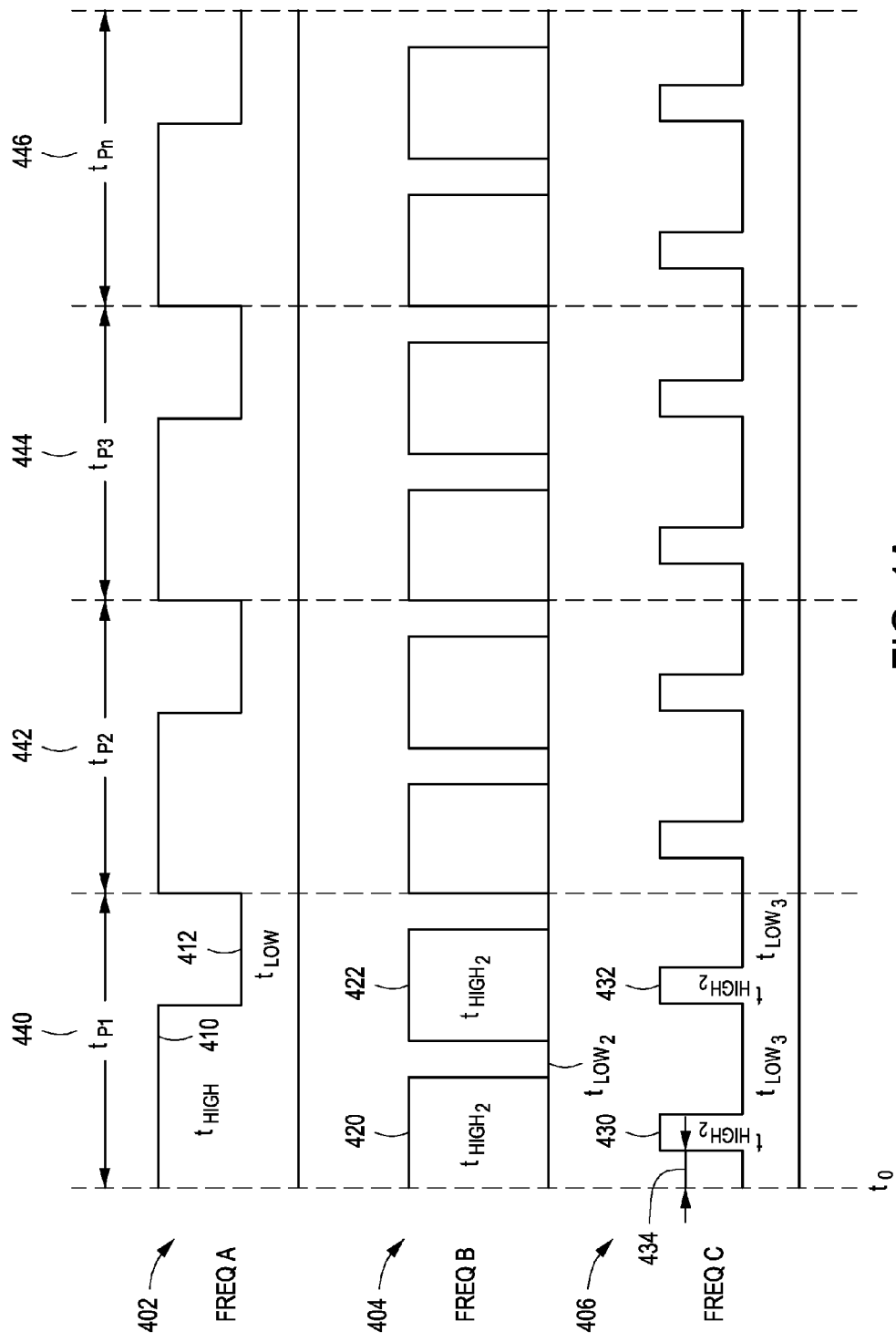

FIG. 4A depicts multiple separate RF power signals pulsed at multiple power levels in accordance with some embodiments of the present disclosure. In FIG. 4A, three separate RF power waveforms, a first RF power waveform 402, a second RF power waveform 404, and a third RF power waveform 406 are shown. Each of the three separate RF power waveforms 402, 404, and 406 may be pulsed at multiple power levels independently and out-of-phase with each other, or with varying duty cycle consistent with embodiments of the present disclosure. The RF power waveforms 402, 404, and 406 may be provided by source and bias RF generators 140, 144, and 148 respectively. The three separate RF power waveforms 402, 404, and 406 may be pulsed synchronously with each other. In some embodiments, the three separate RF power waveforms 402, 404, and 406 may be pulsed asynchronously.

In some embodiments, the frequency of the first RF power waveform may be about 2 Mhz to about 162 MHz. In some embodiments, the first power level of the first pulse duration may be about 200 watts to about 5.0 KW (e.g., 3.6 KW), the value of the second power level may be about 0-100% of the first power level. In other embodiments, the second power level may be greater than the first power level.

In FIG. 4A, the first RF power waveform 402 may be introduced at time $t_0$ and may comprise a first power pulse 410 at a first power level and a second power pulse 412 at a second power level that are applied during two corresponding RF power periods $t_{HIGH1}$ and $t_{LOW1}$. As illustrated in FIG. 4A, the first RF power pulse 410 may precede the second RF power pulse 412. If desired, additional RF power pulses may be provided in that order, or in a different order. As shown in FIG. 4A, the first RF power pulse 410 may be provided at a high power level, the second RF power pulse 412 may be provided at a low power level that is lower than the first power level of the first RF power pulse 410. Additional steps (i.e., additional RF power pulses) and power levels may be used as appropriate. In some embodiments, each of the time periods $t_{HIGH1}$ and $t_{LOW1}$ that each RF power pulse 410 and 412 is applied is different from each other. In other embodiments, the time periods $t_{HIGH1}$ and $t_{LOW1}$ that each RF power pulse 410 and 412 is applied may be equivalent to each other. In some embodiments, the first RF waveform 402 may be provided at a frequency of about 2 MHz to about 162 MHz. In other embodiments, other frequencies as described above may be used.

The second RF power waveform 404 may also be introduced at time $t_0$ or after a delay period (not shown). The second RF power waveform 404 may comprise a first power pulse 420 at a first power level and a second power pulse 422 at a second power level that are applied during two corresponding RF power periods $t_{HIGH2}$ and $t_{LOW2}$. As illustrated in FIG. 4A, the first RF power pulse 420 may precede the second RF power pulse 422. If desired, additional RF power pulses may be provided in that order, or in a different order. As shown in FIG. 4A, the first RF power pulse 420 may be provided at a high power level, the second RF power pulse 422 may be provided at a zero power level, or a low power level that is lower than the first power level of the first RF power pulse 420. Additional steps (i.e., additional RF power pulses) and power levels may be used as appropriate. In some embodiments, each of the time periods $t_{HIGH2}$ and $t_{LOW2}$ that each RF power pulse 420 and 422 is applied is different from each other. In other embodiments, the time periods $t_{HIGH2}$ and $t_{LOW2}$ that each RF power pulse 420 and 422 is applied may be equivalent to each other. In some embodiments, the second RF waveform 404 may be provided at a frequency of about 2 MHz to about 162 MHz. In other embodiments, other frequencies as described above may be used.

The third RF waveform 406 may be introduced after delay 434. In some embodiments, the first delay period may between 10 μs-1 ms. In some embodiments, the delay may be greater than 1 ms. Similar to the first and second RF waveforms 402, 404, the third RF power waveform 406 may comprise a first power pulse 430 at a first power level and a second power pulse 432 at a second power level that are applied during two corresponding RF power periods $t_{HIGH3}$ and $t_{LOW3}$. As illustrated in FIG. 4A, the first RF power pulse 430 may precede the second RF power pulse 432. If desired, additional RF power pulses may be provided in that order, or in a different order. As shown in FIG. 4A, the first RF power pulse 430 may be provided at a high power level, the second RF power pulse 432 may be provided at a zero power level, or a low power level that is lower than the first power level of the first RF power pulse 430. Additional steps (i.e., additional RF power pulses) and power levels may be used as appropriate. In some embodiments, each of the time periods $t_{HIGH2}$ and $t_{LOW2}$ that each RF power pulse 430 and 432 is applied is different from each other. In other embodiments, the time periods $t_{HIGH3}$ and $t_{LOW3}$ that each RF power pulse 430 and 432 is applied may be equivalent to each other. In some embodiments, the second RF waveform 406 may be provided at a frequency of about 2 MHz to about 162 MHz. In other embodiments, other frequencies as described above may be used.

FIG. 4A further depicts that the duty cycles of the three RF power waveforms 402, 404, and 406 are synchronized. That is, each of the three RF power waveforms 402, 404, and 406 have the same power patterns over equivalent time periods $t_{p1}$ 440, $t_{p2}$ 442, $t_{p3}$ 444, and $t_{p4}$ 446.

FIG. 4B depicts further details of the three RF power waveforms 402, 404, and 406 during a single time period $t_{p1}$ 440 (i.e., duty cycle) shown in FIG. 4A. Specifically, FIG. 4B depicts 8 different periods/steps 450 in which the reflected power created by the three RF power waveforms 402, 404, and 406 at each step, and thus the impedance produced at each step, is different from each other.

Figure 5A:
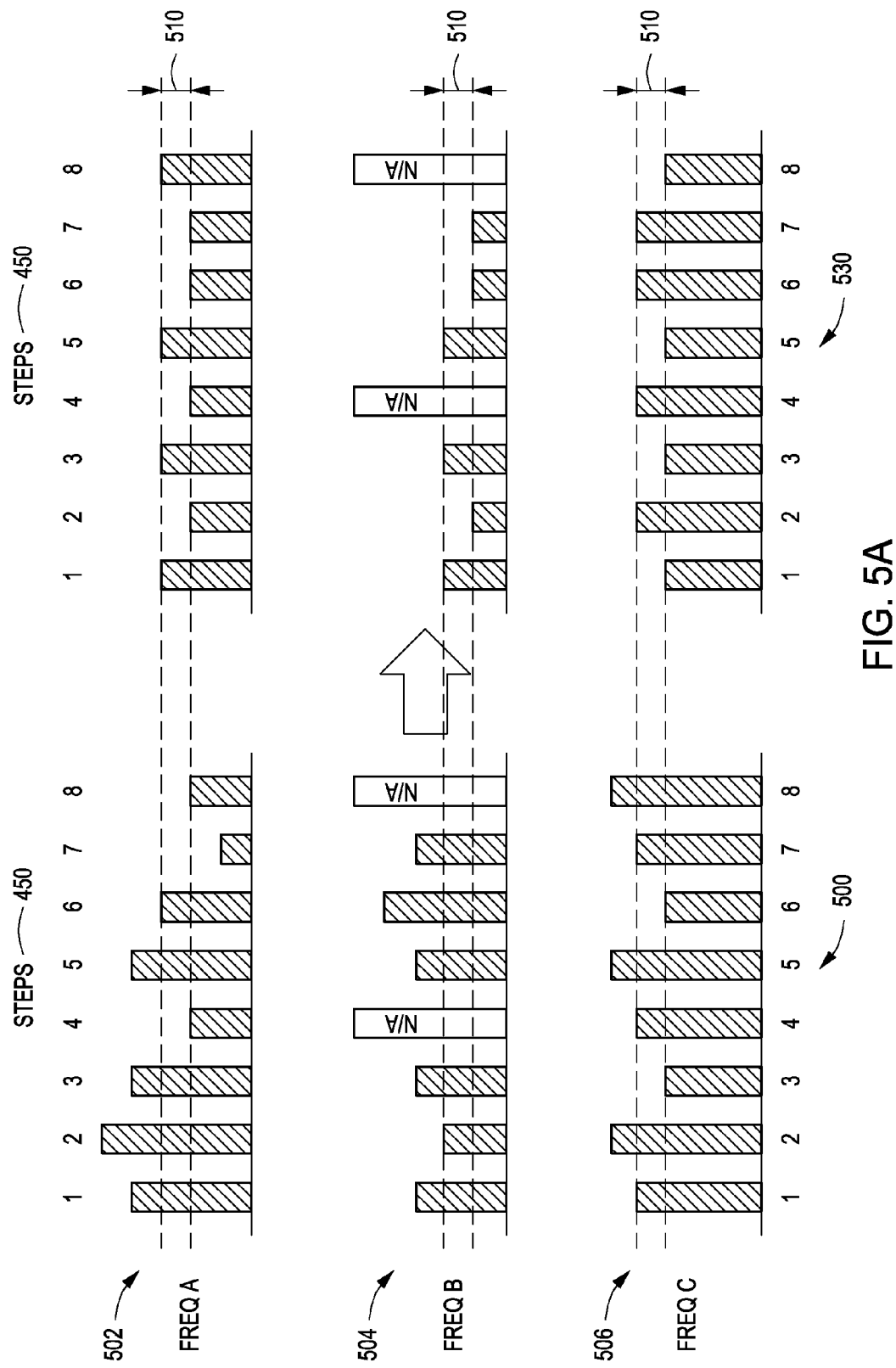
FIG. 5A-5B depicts a tuning method for RF pulse reflection reduction in process chambers that use multiple separate RF power signals pulsed at multiple power levels in accordance with some embodiments of the present disclosure.

FIG. 5A depicts the initial reflected power profile 500 of each of the first RF power waveforms 402 at 502, the second RF power waveforms 404 at 504, and the third RF power waveforms 406 at 506, during each of the 8 periods/steps 450. In some embodiments, the reflected power profiles 502, 504, and 506 for each of the plurality of pulsed RF power waveforms 402, 404, and 406 are affected by all the pulsed RF power waveforms 402, 404, and 406 provided to the process chamber at any given time. In some embodiments, the reflected power may be determined through measurement via one or more sensors communicatively coupled to the RF generators 140, 144 and 148, or by detection of the reflected power by one or more of the RF generators 140, 144 and 148.

The initial reflected powers 500 are reduced through a series of steps to a final reduced set of reflected powers 530 (i.e., the tuning target reflected values) that meets a tuning threshold range 510. The tuning threshold range 510 defines the largest acceptable difference between the highest reflected power for a RF power waveform and the lowest reflected power for a RF power waveform. In some embodiments, the tuning threshold range 510 is a predefined value.

In other embodiments, the tuning threshold range 510 is a calculated or average value. In some embodiments as depicted in FIG. 5A, the same tuning threshold range 510 is used for all three reflected power profiles 502, 504, and 506. Although the tuning threshold range 510 may be the same, as shown in FIG. 5A, the levels at which the range is used for each RF power profile may be different. In some embodiments, different tuning threshold ranges 510 may be applied to the three reflected power profiles 502, 504, and 506. Typically, the tuning threshold range 510 cannot be zero (i.e., attempting to reduce the reflected power to zero) since the tuning parameters have two to three degrees of freedom. That is, in some embodiments, the reflected power is not zero because each of the matching networks 142, 146, and 149 may be in a two-reactance or three-reactance configuration and cannot be adjusted to compensate for all 8 reflected power/impedance periods/steps 420.

Figure 5B:
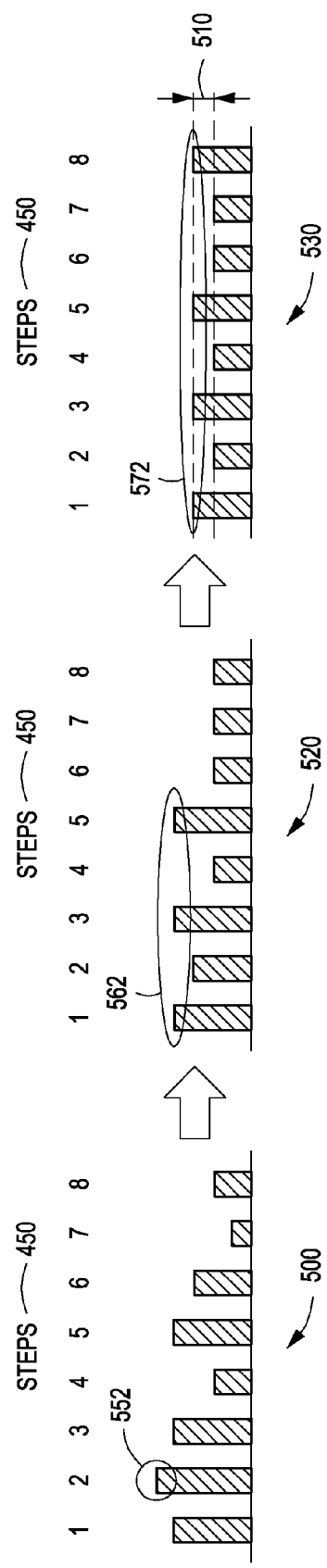
Figure 6:
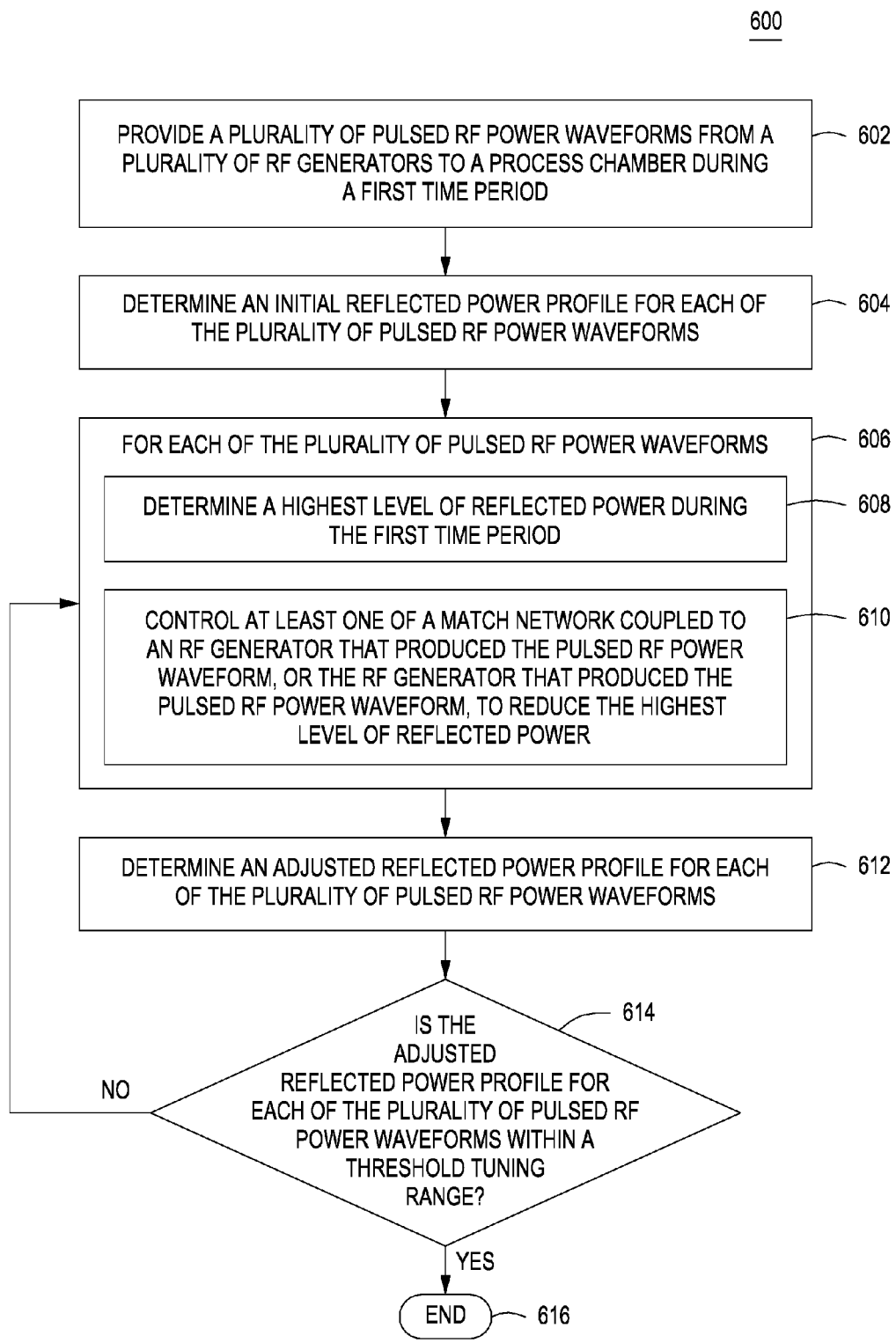
FIG. 6 depicts a flow chart of a method for RF pulse reflection reduction in process chambers that use multiple separate RF power signals pulsed at multiple power levels in accordance with some embodiments of the present disclosure.

FIG. 5B depicts a tuning method for RF pulse reflection reduction in process chambers that use multiple separate RF power signals pulsed at multiple power levels in accordance with some embodiments of the present disclosure. FIG. 5B is discussed with respect to FIG. 6 which depicts a flow chart of a method 600 for RF pulse reflection reduction in process chambers that use multiple separate RF power in accordance with some embodiments of the present disclosure. The method 600 may be performed, for example, in the plasma reactor discussed above in FIG. 1. The method 600 begins at 602 by providing a plurality of pulsed RF power waveforms from a plurality of RF generators to a process chamber during a first time period. In some embodiments, three or more pulsed RF power waveforms are provided to the process chamber by three separate RF generators. In some embodiments, a first pulsed RF power waveform of the plurality of waveforms is an RF source signal, such as, for example, a forward power provided by the generator 140. The first pulsed RF power waveform may be provided at a VHF frequency of between about 60 MHz to about 162 MHz. In some embodiments, the VHF frequency of the first pulsed RF power waveform is about 162 MHz. In some embodiments, the VHF frequency of the first pulsed RF power waveform is about 60 MHz. In some embodiments, the first power level of the first pulsed RF power waveform may be about 200 watts to about 5.0 KW (e.g., 3.6 KW). In some embodiments, a second pulsed RF power waveform of the plurality of waveforms is an RF bias signal, such as, for example, a forward power provided by the generator 144 or 148. In some embodiments, a second pulsed RF power waveform of the plurality of pulsed RF power waveforms is a bias RF power signal, such as, for example, a bias power provided by the generator 144 or 148. The second pulsed RF power waveform may be provided at a frequency of between about 2 MHz to about 162 MHz. In some embodiments, the frequency of the second pulsed RF power waveform is about 60 MHz. In some embodiments, the first power level of the first pulse duration of the second RF source signal may be about 200 watts to about 5.0 KW (e.g., 3.6 KW). In some embodiments, the second pulsed RF power waveform may be synchronized with the first pulsed RF power waveform. Similarly a third pulsed RF power waveform of the plurality of waveforms may also be an RF bias signal, such as, for example, a forward power provided by the generator 144 or 148.

At 604, an initial reflected power profile 500 for each of the plurality of pulsed RF power waveforms is determined (e.g., 502, 504, and 506 in FIG. 5A). In some embodiments, the initial reflected power profile may be obtained through measurement via one or more sensors communicatively coupled to the RF generators 140, 144, and 148, or by detection of the reflected power by one or more of the RF generators 140, 144, and 148. In some embodiments, the initial reflected power profile may be obtained through an estimation or calculation based on the forward power being used. In some embodiments, each initial reflected power profile includes a plurality of different levels of reflected power during the first time period. The reflected power profiles for each of the plurality of pulsed RF power waveforms may be affected by all the pulsed RF power waveforms provided to the process chamber at any given time. For example, FIG. 5B depicts an initial reflected power profile 500 for pulsed RF power waveforms 402.

At 606, a process is run for each of the plurality of pulsed RF power waveforms. Specifically, at 608 a highest level of reflected power during the first time period (e.g., reflected power 552 in FIG. 5B) is determined for each of the plurality of pulsed RF power waveforms. At 610, at least one of a match network coupled to an RF generator that produced the pulsed RF power waveform, or the RF generator that produced the pulsed RF power waveform, is controlled to reduce the highest level of reflected power 552. In some embodiments, the match network includes a variable capacitor, and the variable capacitor is electronically or mechanically tuned to reduce the highest level of reflected power 552. In other embodiments, the RF generator that produced the pulsed RF power waveform is controlled to adjust a frequency of the pulsed RF power waveform to reduce the highest level of reflected power 552.

At 612, an adjusted reflected power profile for each of the plurality of pulsed RF power waveforms is determined (e.g., adjusted reflected power profile 520 for pulsed RF power waveform 402). At 614, the adjusted reflected power profile for each of the plurality of pulsed RF power waveforms is then compared against a threshold tuning range 510. In some embodiments, the threshold tuning range 510 is a range between a highest reflected power for a RF power waveform and a lowest reflected power for a RF power waveform. If, at 614, it is determined that the adjusted reflected power profile for each of the plurality of pulsed RF power waveforms is not within a threshold tuning range, the method 600 returns to 606 and repeats from that point until the adjusted reflected power profile for each of the plurality of pulsed RF power waveforms is within a threshold tuning range. For example, since the adjusted reflected power profile is not within the threshold tuning range 510 in the example shown in FIG. 5B, a new highest reflected power 562 of the adjusted reflected power profile 520 is determined at 608. At 610, at least one of a match network coupled to an RF generator that produced the pulsed RF power waveform, or the RF generator that produced the pulsed RF power waveform, is controlled to reduce the highest level of reflected power 462. At 612, a new adjusted reflected power profile for each of the plurality of pulsed RF power waveforms is determined (e.g., adjusted reflected power profile 530 for pulsed RF power waveform 402). At 614, the new adjusted reflected power profile for each of the plurality of pulsed RF power waveforms is then compared against the threshold tuning range 510. In the example shown in FIG. 5B, the difference between the highest reflected power 572 and the lowest reflected power profile is within the threshold tuning range 510.

If, at 614, it is determined that the adjusted reflected power profile for each of the plurality of pulsed RF power waveforms is within the threshold tuning range, the method 600 proceeds to 616 and stops.

While the foregoing is directed to embodiments of the present disclosure, other and further embodiments of the disclosure may be devised without departing from the basic scope thereof.

The invention claimed is:

1. A method comprising:
   (a) providing a plurality of pulsed RF power waveforms from a plurality of RF generators to a process chamber during a first time period;
   (b) determining an initial reflected power profile for each of the plurality of pulsed RF power waveforms;
   (c) for each of the plurality of pulsed RF power waveforms,
      determining a highest level of reflected power during the first time period, and
      controlling at least one of a match network coupled to an RF generator that produced the pulsed RF power waveform, or the RF generator that produced the pulsed RF power waveform, to reduce the highest level of reflected power;
   (d) determining an adjusted reflected power profile for each of the plurality of pulsed RF power waveforms; and
   (e) repeating (c) and (d) until the adjusted reflected power profile for each of the plurality of pulsed RF power waveforms is within a threshold tuning range.

2. The method of claim 1, wherein each initial reflected power profile includes a plurality of different levels of reflected power during the first time period.

3. The method of claim 1, wherein the reflected power profiles for each of the plurality of pulsed RF power waveforms is affected by all the pulsed RF power waveforms provided to the process chamber at any given time.

4. The method of claim 1, wherein a first pulsed RF power waveform of the plurality of pulsed RF power waveforms is an RF source signal.

5. The method of claim 4, wherein a second pulsed RF power waveform of the plurality of pulsed RF power waveforms is an RF bias signal.

6. The method of claim 1, wherein the initial reflected power profile and the adjusted reflected power profile are measured reflected power values.

7. The method of claim 1, wherein a frequency of each of the plurality of pulsed RF power waveforms is different from each other.

8. The method of claim 1, wherein each of the plurality of pulsed RF power waveforms are synchronized.

9. The method of claim 1, wherein the match network coupled to the RF generator that produced the pulsed RF power waveform is controlled to reduce the highest level of reflected power.

10. The method of claim 9, wherein the match network includes a variable capacitor, and wherein the variable capacitor is electronically or mechanically tuned to reduce the highest level of reflected power.

11. The method of claim 1, wherein the RF generator that produced the pulsed RF power waveform is controlled to adjust a frequency of the pulsed RF power waveform to reduce the highest level of reflected power.

12. The method of claim 1, wherein the threshold tuning range is a range between a highest reflected power for a RF power waveform and a lowest reflected power for a RF power waveform.

13. The method of claim 1, wherein the threshold tuning range is a predefined value.

14. The method of claim 1, wherein the threshold tuning range applied to each of the plurality of RF power waveforms is the same range.

15. A non-transitory computer readable medium having instructions stored thereon that, when executed, cause a method of RF pulse reflection reduction in a process chamber to be performed, the method comprising:
   (a) providing a plurality of pulsed RF power waveforms from a plurality of RF generators to a process chamber during a first time period;
   (b) determining an initial reflected power profile for each of the plurality of pulsed RF power waveforms;
   (c) for each of the plurality of pulsed RF power waveforms,
      determining a highest level of reflected power during the first time period, and
      controlling at least one of a match network coupled to an RF generator that produced the pulsed RF power waveform, or the RF generator that produced the pulsed RF power waveform, to reduce the highest level of reflected power;
   (d) determining an adjusted reflected power profile for each of the plurality of pulsed RF power waveforms; and
   (e) repeating (c) and (d) until the adjusted reflected power profile for each of the plurality of pulsed RF power waveforms is within a threshold tuning range.

16. The non-transitory computer readable medium of claim 15, wherein the match network coupled to the RF generator that produced the pulsed RF power waveform is controlled to reduce the highest level of reflected power.

17. The non-transitory computer readable medium of claim 15, wherein the match network includes a variable capacitor, and wherein the variable capacitor is electronically or mechanically tuned to reduce the highest level of reflected power.

18. The non-transitory computer readable medium of claim 15, wherein the RF generator that produced the pulsed RF power waveform is controlled to adjust a frequency of the pulsed RF power waveform to reduce the highest level of reflected power.

19. A substrate processing system comprising:
   a plurality of RF generators configured to provide a plurality of pulsed RF power waveforms to a process chamber during a first time period;
   a plurality of sensors configured to measure reflected power for the plurality of pulsed RF power waveforms; and
   a plurality of match networks each coupled to one of the plurality of RF generators, wherein each of the plurality of match networks is configured to:
      (a) determine a reflected power profile for one of the plurality of pulsed RF power waveforms based on measurements from one of the plurality of sensors;
      (b) determine a highest level of reflected power of the reflected power profile during the first time period;
      (c) reduce the highest level of reflected power;
      (d) determine an adjusted reflected power profile for each of the plurality of pulsed RF power waveforms based on a second set of measurements from one of the plurality of sensors; and
      (e) repeating (b) and (d) until the adjusted reflected power profile for each of the plurality of pulsed RF power waveforms is within a threshold tuning range.

20. The substrate processing system of claim 19, wherein each reflected power profile includes a plurality of different levels of reflected power during the first time period.

\* \* \* \* \*